United States Patent [19]
Sato et al.

[11] Patent Number: 5,622,794
[45] Date of Patent: Apr. 22, 1997

[54] LIGHT-SHIELDING PHOTOSENSITIVE RESIN COMPOSITION, LIGHT-SHIELDING PHOTOSENSITIVE TRANSFER MATERIAL AND METHOD FOR FORMING LIGHT-SHIELDING FILM

[75] Inventors: Morimasa Sato; Masayuki Iwasaki; Haruhiko Yoshino, all of Shizuoka, Japan

[73] Assignee: Fuji Photo Film Co., Ltd., Kanagawa, Japan

[21] Appl. No.: 354,870

[22] Filed: Dec. 9, 1994

[30] Foreign Application Priority Data

Dec. 9, 1993 [JP] Japan .................................. 5-309263

[51] Int. Cl.$^6$ ........................................ G03F 9/00
[52] U.S. Cl. ........................ 430/7; 430/23; 430/6
[58] Field of Search ........................... 430/67, 23

[56] References Cited

U.S. PATENT DOCUMENTS 4,948,706  8/1990  Sugihara et al. .................. 430/3 R
5,368,991  11/1994  Urichikawa et al. .................. 430/7

FOREIGN PATENT DOCUMENTS 62-9301  1/1987  Japan .
6-59119  3/1994  Japan .

Primary Examiner—S. Rosasco
Attorney, Agent, or Firm—Sughrue, Mion, Zinn, Macpeak & Seas

[57] ABSTRACT

A light-shielding photosensitive resin composition comprising (1) an alkali-soluble binder, (2) a photo-polymerization initiator, (3) an addition-polymerizing monomer having one or more ethylenic, unsaturated double bonds, and (4) one or more colorants, wherein said photo-polymerization initiator is substantially insensitive to light having a wavelength of 400 nm or longer. The composition is preferably coated on a temporary support to form a transfer material. Using the composition or the transfer material, a flat, light-shielding film having a high optical density may be formed on a color filter by self-alignment exposure without using an optical filter.

3 Claims, No Drawings

LIGHT-SHIELDING PHOTOSENSITIVE RESIN COMPOSITION, LIGHT-SHIELDING PHOTOSENSITIVE TRANSFER MATERIAL AND METHOD FOR FORMING LIGHT-SHIELDING FILM

FIELD OF THE INVENTION

The present invention relates to a light-shielding photosensitive resin composition capable of forming a light-shielding film having a high optical density, a light-shielding photosensitive transfer material, and a method for forming a light-shielding film using the resin composition and transfer material. In particular, the light-shielding photosensitive resin composition, the light-shielding photosensitive transfer material and the method for forming a light-shielding film of the present invention are well adapted for forming color filters by self-alignment exposure.

BACKGROUND OF THE INVENTION

To produce color filters by conventional means, for example, black matrices are formed between red (R), green (G) and blue (B) pixels so as to improve their display contrast. Such known means include, for example, a method of forming a film of metal such as chromium to obtain black matrices and a method of using a photosensitive resin containing a dispersion of a light-shielding pigment or the like. According to these methods, the R, G and B pixels are arranged to partly overlap the black matrices so as to prevent the formation of transparent portions caused, for example, by misalignment.

To form black matrices of a film of metal Such as chromium according to the former method, a metallic film is formed on a substrate by metallic vapor deposition, and then the film is patterned by photolithographic etching using a photoresist. According to the latter method, a photosensitive resin layer containing a dispersion of a light-shielding pigment or the like is formed on a substrate by coating or printing, and then the coated substrate is subjected to a process comprising pattern-wise exposure and development to form black matrices.

Regarding the latter method, it is advantageous in view of reduced production costs and production steps to employ a self-alignment system, using a photosensitive resin containing a dispersion of a light-shielding pigment or the like, to form black matrices. This technique is illustrated in JP-A-62-9301 (the term "JP-A" as used herein means an "unexamined published Japanese patent application"). According to this system, a photosensitive resin layer containing a dispersion of a light-shielding black pigment, such as carbon black, or the like, is formed on a substrate having thereon R, G and B pixels. The coated substrate is then exposed to light which is applied thereto from the back surface of the substrate while the R, G and B pixels act as photo-masks, to thereby form black matrices between the pixels. The system is advantageous in that a positioning step for alignment, which, however, was indispensable in the conventional means, is not needed. Furthermore, this system, in principle, does not give rise to any transparent portions.

According to the self-alignment system, however, the photosensitive light-shielding material provided on the B pixels reacts with light passing through the B pixels having a large light transmittance at about 400 nm. This causes fog due to the light-shielding material remaining on the B pixels. In order to avoid this problem, it was necessary to reduce the amount of light applied to the back surface of the substrate for exposure, while controlling the amount of this light so as not to fog the B pixels. In this case, however, since a sufficient amount of light could not be applied to the back surface of the substrate for satisfactory exposure, the desired light-shielding film was partly etched by development with the result that the optical density of the light-shielding film was lowered.

In order to prevent the above-described fogging of B pixels caused by exposure from the back surface of the substrate, JP-A-6-59119 proposed a method of exposing the substrate from its back surface, via an optical filter capable of cutting off light having a wavelength of 400 nm or longer, to thereby form a light-shielding film having a high optical density. However, the method is disadvantageous in that the optical filter is thermally weak. That is, when the optical filter is set up between a sample and a light source, the optical filter expand on account of the heat of the light source to be damaged.

SUMMARY OF THE INVENTION

A first object of the present invention is to provide a light-shielding photosensitive resin composition capable of forming a light-shielding film having a high optical density without using an optical filter.

A second object of the present invention is to provide a light-shielding photosensitive resin transfer material, which is used to form a light-shielding film having a high optical density without using an optical filter.

A third object of the present invention is to provide a method of forming black matrices having a high optical density in a self-alignment system without using an optical filter.

Other objects and effects of the present invention will be apparent from the following description.

The first object of the present invention has been attained by a light-shielding photosensitive resin composition comprising (1) an alkali-soluble binder, (2) a photo-polymerization initiator, (3) an addition-polymerizing monomer having one or more ethylenic, unsaturated double bonds, and (4) one or more colorants, wherein said photo-polymerization initiator is substantially insensitive to light having a wavelength of 400 nm or longer.

The second object of the present invention has been attained by a light-shielding photosensitive transfer material comprising a temporary support having thereon a layer of the light-shielding photosensitive resin composition described above. The light-shielding photosensitive resin composition may be formed on the temporary support either directly or via a subbing layer formed on the support. The subbing layer controls the degree of adhesion between the support and the resin layer.

The third object of the present invention has been attained by a method for forming a light-shielding film, comprising (1) forming a layer of the light-shielding photosensitive resin composition described above, selectively or wholly on the front surface of a transparent substrate having thereon an image composed of red, blue and green pixels and a non-pixel area, (2) selectively or wholly exposing the light-shielding photosensitive resin layer through the back side of the transparent substrate, and (3) developing the thus-exposed resin layer to form a light-shielding film on a part or all of the non-pixel area; or a method for forming a light-shielding film, comprising (1) attaching the light-shielding photosensitive transfer material described above to the surface of a transparent substrate having thereon an image composed of red, blue and green pixels and a non-pixel area, under heat to thereby selectively or wholly transfer the light-shielding photosensitive resin layer to a part or the whole of the surface of the front substrate, (2) selectively or wholly exposing the light-shielding photosensitive resin layer through the back side of the transparent substrate, and (3) developing the thus-exposed resin layer to form a light-shielding film on a part or all of the non-pixel area.

DETAILED DESCRIPTION OF THE INVENTION

The alkali-soluble binder for use in the present invention includes polymers having side chains containing carboxylic acid groups, for example, methacrylic acid copolymers, acrylic acid copolymers, itaconic acid copolymers, crotonic acid copolymers, maleic acid copolymers, partially-esterified maleic acid copolymers, etc., such as those described in JP-A-59-44615, JP-A-54-34327, JP-B-58-12577, JP-B-54-25957 (the term "JP-B" as used herein means an "examined published Japanese patent application"), JP-A-59-53836 and JP-A-59-71048; as well as cellulose derivatives having side chains containing carboxylic acid groups. In addition, adducts formed by adding cyclic acid anhydrides to polymers having hydroxyl groups are also useful. Of these, especially preferred are copolymers composed of benzyl (meth)acrylate and (meth)acrylic acids, and multi-copolymers composed of benzyl (meth)acrylate, (meth)acrylic acid and other monomers, such as those described in U.S. Pat. No. 4,139,391. The above-described binders are water-insoluble. In addition thereto, water-soluble polymers that are also alkali-soluble such as polyvinyl pyrrolidone, polyethylene oxide, polyvinyl alcohol, etc. can be used.

Apart from the above-described alkali-soluble binders, alkali-insoluble polymers may also be added to the resin composition so as to improve various properties of the light-shielding film to be formed, for example, to improve the strength of the hardened film, provided that the alkali-insoluble polymers do not adversely affect the developability, etc. of the resin layer. Useful alkali-insoluble polymers include alcohol-soluble nylons and epoxy resins.

The solid content (i.e., the content excluding any solvent) of the binder in the light-shielding photosensitive resin composition is preferably from 10 to 95% by weight, more preferably from 20 to 90% by weight, based on the total solid content of the photosensitive resin composition. If the solid content of the binder is less than 10% by weight, the surface tackiness of the photosensitive resin layer is too high. However, if the solid content of the binder is more than 95% by weight, the physical strength of the image to be formed is low and sensitivity of the composition to light is low.

The photo-polymerization initiator for use in the present invention includes vicinal polyketaldonyl compounds such as those described in U.S. Pat. No. 2,367,660, acyloin ether compounds such as those described in U.S. Pat. No. 2,448,828, α-hydrocarbon-substituted aromatic acyloin compounds such as those described in U.S. Pat. No. 2,722,512, polynuclear quinone compounds such as those described in U.S. Pat. Nos. 3,046,127 and 2,951,758, combinations of triarylimidazole dimers and p-aminoketones such as those described in U.S. Pat. No. 3,549,367, benzothiazole compounds and trihalomethyl-s-triazine compounds such as those described in JP-B-51-48516, trihalomethyl-s-triazine compounds such as those described in U.S. Pat. No. 4,239,850, and trihalomethyloxadiazole compounds such as those described in U.S. Pat. No. 4,212,976. Especially preferred are trihalomethyl-s-triazines, trihalomethyloxadiazoles, and triarylimidazole dimers. Among these compounds, those substantially insensitive to light having a wavelength of 400 nm or longer may be selected without particular limitation. The characteristic of the photo-polymerization initiator which is "substantially insensitive light having a wavelength of 400 nm or more" depends on the spectral sensitivity of the initiator, and is defined by a ratio of A/B of 0.1 or less, where A is the area under the spectral sensitivity curve of the photo-polymerization initiator at wavelength of 400 nm and longer, and B is that of less than 400 nm. The sensitivity can be preferably defined by the spectral characteristic of the substrate, on which the light-shielding film is formed, to limit the area B to that between the lowermost wavelength at which the transmittance of the substrate is 10% or more and 400 nm. For example, when boro-silicate glass is used as the substrate, the spectral wavelength at which the transmittance of this substrate is 10% or more is 290 nm so that B includes the area between 290 nm and 400 nm. Further, the sensitivity can also be defined by the kind of the light source used for exposing the light-shielding film and the area B can be limited. For example, when an ultra-high pressure mercury vapor lamp is used as the light source for exposure, B is the area under the spectral sensitivity curve of the photo-polymerization initiator at wavelength between 350 nm and 400 nm.

Specific examples of preferred photo-polymerization initiators for use in the present invention are shown below. However, the present invention should not be construed as being limited thereto:

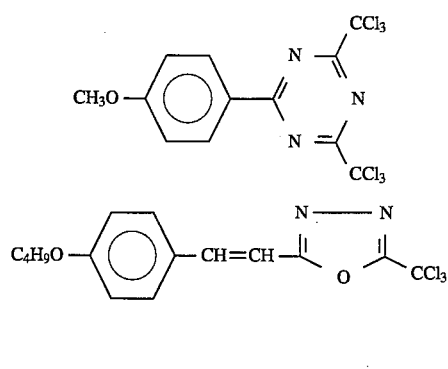

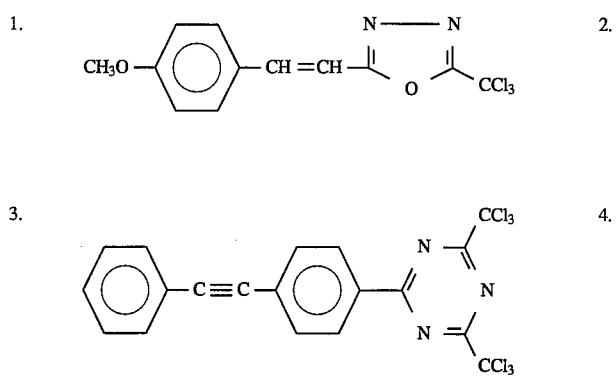

-continued
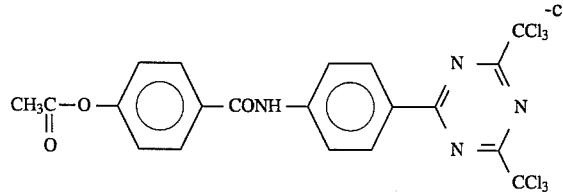 5.
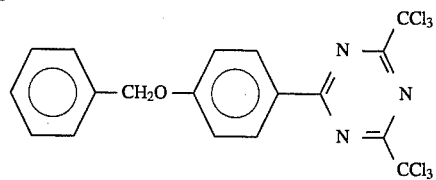 6.
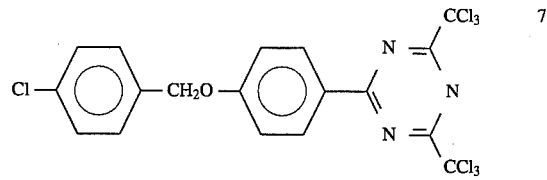 7.
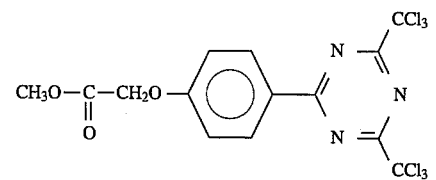 8.
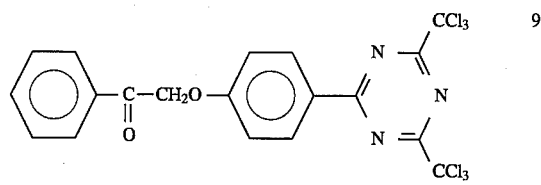 9.
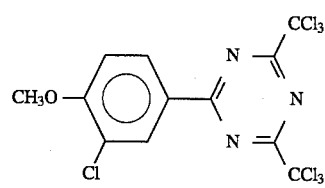 10.
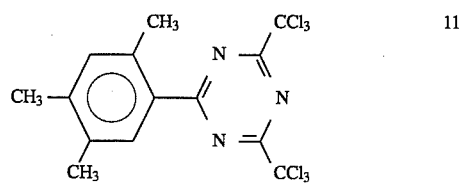 11.
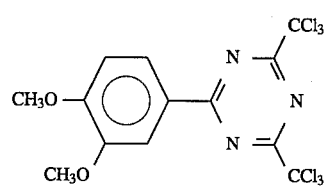 12.
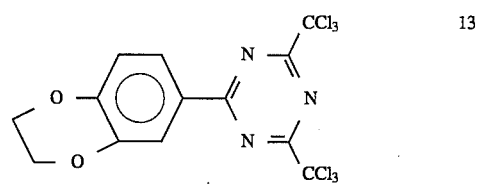 13.
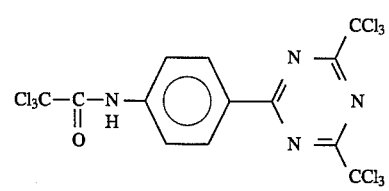 14.
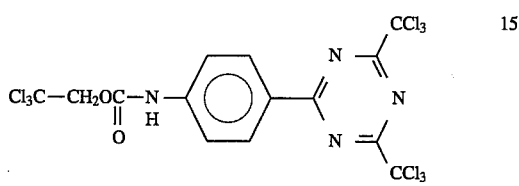 15.
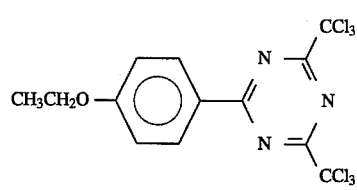 16.
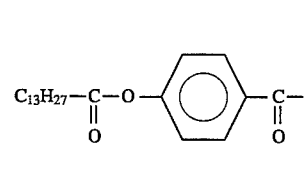 17.
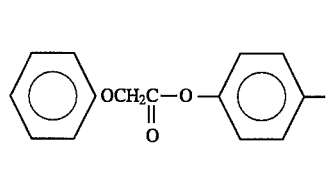 18.
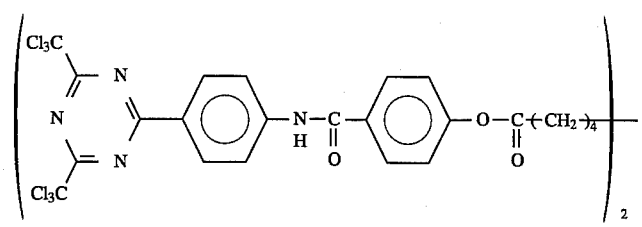 19.

A coating liquid having formula C1, as described in EXAMPLE 1 below, containing each of compound Nos. 1 to 19 as photo-polymerization initiator was respectively coated onto boro-silicate glass and dried to make a light-shielding photosensitive resin layer having a dry thickness of 2 μm. The ratio (A/B) of the area (A) of the spectral sensitivity curve at wavelengths of 400 nm and longer to the area (B) of the same curve between 290 nm and 400 nm was found to be 0.01 or less for each sample thus prepared.

The solid content of the photo-polymerization initiator in the photo-polymerizing composition is from 0.5 to 20% by weight, more preferably from 1 to 15% by weight, based on the total solid content of the photosensitive resin composition. If the solid content of the photo-polymerization initiator is less than 0.5% by weight, the photosensitivity of the photosensitive resin composition is low and the physical strength of the resulting image is low. If, however, the solid content of the photo-polymerization initiator is more than 20% by weight, the properties of the resulting light-shielding film do not further improve.

The addition-polymerizing monomer having one or more ethylenic, unsaturated double bonds for use in the present invention includes compounds having at least one addition-polymerizing, ethylenic, unsaturated group and a boiling point of 100° C. or higher at normal pressure. Useful compounds include, for example, mono-functional acrylates and mono-functional methacrylates such as polyethylene glycol mono(meth)acrylate, polypropylene glycol mono(meth)acrylate, phenoxyethyl (meth)acrylate, etc.; polyethylene glycol di(meth)acrylate, polypropylene glycol di(meth)acrylate, trimethylolethane triacrylate, trimethylolpropane triacrylate, trimethylolpropane diacrylate, neopentylglycol di(meth)acrylate, pentaerythritol tetra(meth)acrylate, pentaerythritol (meth)acrylate, dipentaerythritol hexa(meth)acrylate, dipentaerythritol penta(meth)acrylate, hexanediol di(meth)acrylate, trimethylolpropane tri(acryloyloxypropyl) ether, tri(acryloyloxyethyl) isocyanurate, tri(acryloyloxyethyl) cyanurate, glycerine tri(meth)acrylate, as well as monomers obtained by adding ethylene oxide or propylene oxide to a poly-functional alcohol, such as trimethylolpropane, glycerin, etc., followed by (meth)acrylating the resulting adduct; urethane acrylates such as those described in JP-B-48-41708, JP-B-50-6034 and JP-A-51-37193; polyester acrylates such as those described in JP-A-48-64183, JP-B-49-43191 and JP-B-52-30490; and poly-functional acrylates and methacrylates, such as epoxy acrylates, etc., which are products obtained by reacting epoxy resins and (meth)acrylic acids. More preferred are trimethylolpropane tri(meth)acrylate, pentaerythritol tetra(meth)acrylate, dipentaerythritol hexa(meth)acrylate, dipentaerythritol penta(meth)acrylate.

The solid content of the addition-polymerizing monomer having one or more ethylenic, unsaturated double bonds in the light-shielding photosensitive resin composition is preferably from 5 to 50% by weight, more preferably from 10 to 40% by weight, based on the total solid content of the photosensitive resin composition. If the solid content of the addition-polymerizing monomer is less than 5% by weight, the photosensitivity of the photosensitive resin composition is low and the physical strength of the resulting image is low. However, if the solid content of the addiiton-polymerizing monomer is more than 50% by weight, the surface tackiness of the photosensitive resin layer is unfavorably too high.

The colorants for use in the present invention include Carmine 6B (C.I. 12490), Phthalocyanine Green (C.I. 74260), Phthalocyanine Blue (C.I.74160), Mitsubishi Carbon Black MA-100 Perylene Black (BASF K0084 and K0086), Cyanine Black #1201, Lionol Yellow (C.I. 21090), Lionol Yellow GRO (C.I. 21090), Symuler Fast Yellow 8GF (C.I. 21105), Benzidine Yellow 4T-564D (C.I. 21095), Symuler Fast Red 4015 (C.I. 12355), Lionol Red 7B4401 (C.I. 15850), Fastogen Blue TGR-L (C.I. 74160), Lionol Blue SM (C.I. 26150), Mitsubishi Carbon Black MA-100, Mitsubishi Carbon Black #40, Victoria Pure Blue (C.I. 42595), Auramine O (C.I. 41000), Carotene Brilliant Flavin (C.I. Basic 13), Rhodamine 6GCP (C.I. 45160), Rhodamine B (C. I. 45170), Safranine OK 70:100 (C.I. 50240), Erio Glaucine X (C.I. 42080), Fast Black HB (C.I. 26150), C.I. Pigment Red 122, C.I. Pigment Red 149, C.I. Pigment Red 168, C.I. Pigment Red 177, C.I. Pigment Red 180, C.I.Pigment Red 192, C.I. Pigment Red 215, C.I. Pigment Green 7, C.I. Pigment Green 36, C.I.Pigment Blue 15:1, C.I. Pigment Blue 15:4, C.I. Pigment Blue 15:6, C.I. Pigment Blue 22, C.I. Pigment Blue 60, C.i. Pigment Blue 64, C.I. Pigment Yellow 139, C.I. Pigment Yellow 83, C.I. Pigment Violet 23. In addition thereto, a metal powder, a white pigment, and a fluorescent pigment are used as well. Especially preferred are mixtures of two or more kinds of these colorants, provided that a combination and a mixing ratio of the mixtures are selected so that the light-shielding photosensitive resin composition is equivalent or close to a black color in terms of a hue and when a light-shielding photosensitive resin composition layer has a film thickness of 1 to 3 μm, the transmittability in a visible ray region becomes 2 or less and a ratio of the transmittability in the visible region to a transmittability in a UV region becomes 1:1 to 20:1.

The solid content of the one or more colorants in the light-shielding photosensitive resin composition is preferably from 1 to 50% by weight, based on the total solid content of the photosensitive resin composition.

In addition to the above-described components, the photosensitive resin composition of the present invention preferably contains a thermal polymerization inhibitor. Useful examples of the inhibitor include hydroquinone, p-methoxyphenol, di-t-butyl-p-cresol, pyrogallol, t-butylcatechol, benzoquinone, 4,4'-thiobis(3-methyl-6-t-butylphenol), 2,2'-methylenebis(4-methyl-6-t-butylphenol), 2-mercaptobenzimidazole, phenothiazine, etc.

Further, the photosensitive resin composition of the present invention may optionally contain, as needed, known additives such as a plasticizer, a surfactant, a solvent, etc.

The optical density of the light-shielding film formed from the light-shielding photosensitive resin composition of the present invention is generally from 0.01 to 5, preferably from 0.05 to 1, in terms of the Y value according to CIE 1931 standard colorimetry. The thickness of the light-shielding film is preferably from 1 μm to 3 μm. If the thickness is less than 1 μm, the pigment content of the light-shielding film must be increased to obtain the desired optical density, which in turn, however, reduces developability of the resin composition. If, on the other hand, the thickness is more than 3 μm, various problems occur in that developability of the resin composition and reproducibility of the film to form images are reduced. The thickness of the light-shielding film may be selected without particular limitation within the above-described range. In particular, when a color filter is prepared in accordance with the present invention, the surface of the finished color filter is desirably flat. The "flatness" used herein is defined by the difference between the thickness of the color layers (red, blue and green layers) and that of the light-shielding film. Therefore, in this case, the light-shielding film desirably has the same thickness as the color layers. The flatness of the color filter in accordance with the present invention is generally not more than ±1.0 μm, preferably not more than ±0.5 μm.

The light-shielding photosensitive resin composition of the present invention may be provided on a substrate by known methods. For instance, the photosensitive resin composition may be coated on a substrate using, e.g., a spinner, a whirler, a roller coater, a curtain coater, a knife coater, a wire bar coater, an extruder, etc., and then dried to form a light-shielding photosensitive resin layer on the substrate.

Especially preferred is a transfer system in which a light-shielding photosensitive transfer material having a light-shielding photosensitive resin composition layer of the present invention provided on a temporary support is applied to a substrate to transfer the layer onto the substrate. Useful transfer materials for the transfer system, for example, include that described in U.S. Pat. No. 5,292,613, which comprises a temporary support having formed thereon in sequence a thermoplastic resin layer, a interlayer having only slight permeability to oxygen, and a light-shielding photosensitive resin layer, wherein the adhesion between the thermoplastic resin layer and the interlayer is the weakest; that described in U.S. Pat. No. 5,294,516, which comprises a temporary support and an alkali-soluble thermoplastic resin layer having a thickness of 6 µm to about 100µm, a water or aqueous alkali-soluble or dispersible interlayer having a low oxygen permeability, and a light-shielding photosensitive resin layer arranged in the order of increasing distance from the temporary support, wherein the adhesion between the temporary support and the thermoplastic resin layer is the weakest; and that described in U.S. Pat. No. 5,298,360, which comprises a light-shielding photosensitive resin layer coated on a temporary support, wherein a interlayer is interposed between the light-shielding photosensitive resin layer and the temporary support, with the interlayer having a stronger adhesion to the light-shielding photosensitive resin layer than to the temporary support, a low oxygen permeability and a softening point of about 80° C. or below.

To form a light-shielding film of the present invention, the back surface of the substrate having the resin layer of the present invention on the front side thereof is exposed to light (back surface exposure). The light source for the back surface exposure is selected depending on the photosensitivity of the light-shielding photosensitive resin layer formed on the front side of the substrate. For example, known light sources such as ultra-high pressure mercury vapor lamps, xenon lamps, carbon-arc lamps, argon lasers, etc. may be used.

Development may be carried out by conventional means, for example, by treating the material with a solvent or a developing solution, especially with an alkali solution. An illustrative example of such a development step is disclosed in U.S. Pat. No. 5,155,005.

Useful substrate used in the present invention is substantially colorless transparent substrate. Specifically, a polymer substrate such as polycarbonate, or a glass substrate is preferably used. A thickness of the substrate is preferably from 50 µm to 10 mm, particularly preferably from 0.1 mm to 2 mm.

The temporary support in the light-shielding photosensitive transfer material of the present invention is preferably composed of a chemically and thermally stable flexible substance that is easily releasable from the thermoplastic resin layer. In particular, a thin sheet of Teflon, polyethylene terephthalate, polycarbonate, polyethylene, polypropylene, etc. or laminate thereof is preferred.

Forming a multicolor-pattern consisting of R, G and B pixels onto the transparent substrate is carried out by all known methods such as dyeing, printing, pigment dispersion, electrodeposition, transfering, etc.

The light transmittance of the R, G and B pixels provided on the substrate is preferably 2% or less within the wavelength range to which the light-shielding photosensitive resin layer is sensitive. In case that a light transmittance of the R, G and B pixels within the sensitive wavelength range of the light-shielding photosensitive resin exceeds 2%, light absorption agents is preferably added into the R, G and B pixels to lower the light transmittance to not more than 2%.

As the light absorption agents of the present invention, known compounds may be used, e.g., benzophenone derivatives (such as N, N'-tetramethyl-4,4'-diaminobenzophenone), merocyanine compounds, metallic oxide, benzotriazole compounds, coumarine compounds, etc. Of these, preferred are light absorption agents having an excellent light absorption property and retaining a light absorption ability of not less than 25% even after heat-treating at the temperature of 200° C. or more. Specific examples of them include zinc oxide, benzotriazole compounds and coumarine compounds. Of these, coumarine compounds are particularly preferred from the view points of both the thermal resistance and the light absorption ability. When a photopolymeric compound is used for forming a multicolor-pattern, the coumarine compounds are further preferred because of not inhibiting the photopolymerization. The above heat-treating is carried out, if needed, in order to still more harden the pattern pixels in forming a color filter.

The present invention will be explained in more detail by means of the following Examples, but it should be understood that the present invention is not construed as being limited thereto. All the parts are by wight unless otherwise indicated.

EXAMPLE 1

Formation of Light-shielding Photosensitive Transfer Material

A coating liquid having the formulation H1 mentioned below was coated and dried on a temporary support of polyethylene terephthalate film having a thickness of 100 µm to form thereon a thermoplastic resin layer having a dry thickness of 20 µm.

Formulation H1 for thermoplastic resin layer:

| | |
|---|---|
| Copolymer of methyl methacrylate/2-ethylhexyl acrylate/benzyl methacrylate/methacrylic acid (55/28.8/11.7/4.5, by mol) having a weight-average molecular weight of 80,000 | 15.0 parts |
| BPE-500 (poly-functional acrylate, made by Shin-Nakamura Chemical Co.) | 7.0 parts |
| F177P (fluorine-containing surfactant, made by Dai-Nippon Ink Co.) | 0.3 parts |
| Methanol | 30.0 parts |
| Methyl Ethyl Ketone | 19.0 parts |
| 1-Methoxy-2-propanol | 10.0 parts |

Next, a coating liquid having formulation B1 below was coated and dried on the thus-formed thermoplastic resin layer to form thereon an interlayer having a dry thickness of 1.6 µm.

Formulation B1 for interlayer:

| | |
|---|---|
| Polyvinyl alcohol (PVA 205 made by Kuraray Co., having a degree of saponification of 80%) | 130 parts |

| | |
|---|---|
| Polyvinyl pyrrolidone (PVP K-30 made by GAF Corp.) | 60 parts |
| Distilled water | 2110 parts |
| Methanol | 1750 parts |

A coating liquid having formula C1 below was coated and dried on the temporary support having the above-described thermoplastic resin layer and interlayer, to form thereon a light-shielding photosensitive resin layer having a dry thickness of 2 μm.

Formulation C1:

| | |
|---|---|
| Copolymer of benzyl methacrylate/ methacrylic acid (70/30, by mol) having an intrinstic viscosity of 0.12 | 11.00 parts |
| Dipentaerythritol hexa-acrylate | 10.60 parts |
| Bis[4-[N-[4-(4,6-bistrichloromethyl-s-triazin-2-yl)phenyl]carbamoyl]phenyl] sebacate (photo-polymerization initiator) | 0.52 parts |
| Pigment Red 177 | 4.00 parts |
| Pigment Blue 15:6 | 2.86 parts |
| Pigment Yellow 139 | 2.27 parts |
| Pigment Violet 23 | 0.39 parts |
| Carbon black | 1.70 parts |
| Hydroquinone monomethyl ether | 0.01 parts |
| F177P (surfactant made by Dai-Nippon Ink Co.) | 0.07 parts |
| Methyl cellosolve acetate | 40.00 parts |
| Methyl ethyl ketone | 125.00 parts |

A cover sheet of polypropylene having a thickness of 12 μm was attached under pressure to the top surface of the above-described, light-shielding photosensitive resin layer to form a light-shielding photosensitive transfer material. According to CIE 1931 Standard colorimetry, the chromaticity and the luminous intensity (optical density) are converted into numerical values, and each is represented by x and y values, and Y value, respectively. The Y value of the light-shielding photosensitive resin layer was 0.7, when F10 was used as the light source. The layer had a light transmittance of 0.3% at 365 nm, and the ratio of the Y value to the transmittance at 365 nm was about 2.3/1. The absolute value of a difference between each of the x and y values and the achromatic color point in the CIE chromaticity diagram was 0.08 and 0.07, respectively. The ratio (A/B) of the area (A) of the spectral sensitivity curve of the photo-polymerization initiator at wavelengths of 400 nm and longer to the area (B) of the curve between 350 nm and 400 nm was 0.1 or less.

The same color filter, as described in Example 1 of Japanese Patent Application No. 4-150691, having R, G and B pixels and having a thickness of 2 μm was formed on a substrate of boro-silicate glass ("#7059" manufactured by Corning Japan Co.) having a thickness of 1.1 mm. The light transmittance of the B pixels at wavelengths of 400 nm or longer was 10% or more. The cover sheet of the light-shielding photosensitive transfer material prepared as described above was removed, and the material was attached to the thus-prepared R-G-B color filter using a laminator (VP-11, made by Taisei Laminator Co.) under pressure of 0.8 kg/cm² and under heat at 130° C., so that the light-shielding photosensitive resin layer faced the color filter. Then, the temporary support was removed by peeling at the interface between the temperature support and the thermoplastic resin layer.

Next, the light-shielding photosensitive resin layer was exposed to light by back surface exposure, using an ultrahigh pressure mercury vapor lamp, so that light from the lamp was incident on the glass substrate. The back surface exposure of the light-shielding photosensitive resin layer was effected at an exposure amount of 100 mj/cm², via a mask positioned between the light source and the sample. In this manner, a part or all of the non-pixel area and a part of the substrate (the outer periphery of the color filter area) was exposed. After exposure, the sample was developed with an aqueous 1% sodium carbonate solution to remove the unexposed portions of the film, to form a light-shielding film in the interspaces between the R, G and B pixels and the outer periphery of the color filter. In the thus prepared color filter, the light-shielding film did not overlap with the R-G-B layers, and had a high optical density of 0.7 in terms of the Y value by CIE 1931 standard colorimetry. The color filter was flat to within +/−0.1 μm.

COMPARATIVE EXAMPLE 1

The procedure of Example 1 was repeated, except that a coating liquid having formulation C2 described below was coated and dried on the substrate to form a light-shielding photosensitive resin layer having a dry thickness of 2 μm.

Formulation C2:

| | |
|---|---|
| Copolymer of benzyl methacrylate/ methacrylic acid (70/30, by mol) having an intrinstic viscosity of 0.12 | 11.00 parts |
| Dipentaerythritol hexa-acrylate | 10.60 parts |
| 2,4-bis(trichloromethyl)-6-[4-(N,N-diethoxycarbomethyl)-3-bromophenyl]-s-triazine (photo-polymerization initiator) | 0.52 parts |
| Pigment Red 177 | 4.00 parts |
| Pigment Blue 15:6 | 2.86 parts |
| Pigment Yellow 139 | 2.27 parts |
| Pigment Violet 23 | 0.39 parts |
| Carbon black | 1.70 parts |
| Hydroquinone monomethyl ether | 0.01 parts |
| F177P (surfactant, made by Dai-Nippon Ink Co.) | 0.07 parts |
| Methyl cellosolve acetate | 40.00 parts |
| Methyl ethyl ketone | 125.00 parts |

The ratio (A/B) of the area (A) of the spectral sensitivity curve of the photo-polymerization initiator at wavelengths of 400 nm and longer to the area (B) of the sensitivity curve between 350 nm and 400 nm was not less than 0.2. As a result, the back surface exposure caused fog on the B pixels such that a part of the light-shielding material remained on the B pixel area after the development.

When the back surface exposure was effected at a lower intensity of 50 mj/cm², no fog occurred on the B pixels. However, but the -optical density of the light-shielding film thus formed was 1.5 in terms of the Y value in CIE 1931 Standard colorimetry.

Using the light-shielding photosensitive resin composition of the present invention, a color filter having a flat light-shielding film with a high optical density is obtained by a simple back surface exposure.

While the invention has been described in detail and with reference to specific embodiments thereof, it will be apparent to one skilled in the art that various changes and modifications can be made therein without departing from the spirit and scope thereof.

What is claimed is:

1. A method for forming a light-shielding film, comprising the steps of:

(1) forming a layer of a light-shielding photosensitive resin composition selectively or wholly on the front surface of a transparent substrate having thereon an image composed of red, blue and green pixels and a non-pixel area;

(2) selectively or wholly exposing the layer through the back side of the transparent substrate; and (3) developing the thus-exposed layer to form a light-shielding film on a part or all of the non-pixel area;

wherein the light-shielding photosensitive resin composition comprises: (1) an alkali-soluble binder; (2) a photo-polymerization initiator; (3) an addition-polymerizing monomer having one or more ethylenic, unsaturated double bonds; and (4) one or more colorants;

and wherein the spectral sensitivity of the photo-polymerization initiator relative to the spectral characteristic of the transparent substrate has a ratio A/B of 0.1 or less, where A is the area under a spectral sensitivity curve of the photo-polymerization initiator at a wavelength of 400 nm or longer and B is the area under the same spectral sensitivity curve between the lowermost wavelength at which transmittance of the substrate is 10% or more and 400 nm.

2. The method of claim 1, wherein the light-shielding film has a thickness of from 1 to 3 μm.

3. A method for forming a light-shielding film, comprising the steps of:

(1) attaching a light-shielding photosensitive transfer material to the front surface of a transparent substrate having thereon an image composed of red, blue and green pixels, and a non-pixel area, under heat, to thereby selectively or wholly transfer a light-shielding photosensitive resin layer to a part or the whole of the front surface of the substrate;

(2) selectively or wholly exposing the layer through the back side of the transparent substrate; and (3) developing the thus-exposed layer to form a light-shielding film on a part or all of the non-pixel area;

wherein the light-shielding photosensitive transfer material comprises a temporary support having thereon a layer of a light-shielding photosensitive resin composition comprising: (1) an alkali-soluble binder; (2) a photo-polymerization initiator; (3) an addition-polymerizing monomer having one or more ethylenic, unsaturated double bonds; and (4) one or more colorants;

and wherein the spectral sensitivity of the photo-polymerization initiator relative to the spectral characteristic of the transparent substrate has a ratio A/B of 0.1 or less, where A is the area under a spectral sensitivity curve of the photo-polymerization initiator at a wavelength of 400 nm or longer and B is the area under the same spectral sensitivity curve between the lowermost wavelength at which transmittance of the substrate is 10% or more and 400 nm.

* * * * *